United States Patent [19]

Cherian et al.

[11] 4,161,346

[45] Jul. 17, 1979

[54] CONNECTING ELEMENT FOR SURFACE TO SURFACE CONNECTORS

[75] Inventors: Gabriel B. Cherian, York; William S. Scheingold, Palmyra, both of Pa.

[73] Assignee: AMP Incorporated, Harrisburg, Pa.

[21] Appl. No.: 935,839

[22] Filed: Aug. 22, 1978

[51] Int. Cl.[2] .................................... H05K 1/12

[52] U.S. Cl. ........................ 339/17 M; 339/254 M

[58] Field of Search ........... 339/17 R, 17 CF, 17 LM, 339/17 M, 59 M, 61 M, 254 R, 254 M

[56] References Cited

U.S. PATENT DOCUMENTS

| | | | |
|---|---|---|---|
| 2,145,166 | 1/1939 | Douglas | 339/254 R |
| 2,153,176 | 4/1939 | Douglas | 339/254 R |
| 2,154,247 | 4/1939 | Muldoon et al. | 339/254 R |
| 3,877,064 | 4/1975 | Scheingold et al. | 357/74 |
| 3,910,664 | 10/1975 | Pauza et al. | 339/17 CF |
| 4,052,118 | 10/1977 | Scheingold et al. | 339/17 CF |

OTHER PUBLICATIONS

IBM Tech. Disclosure Bulletin, Schick, vol. 6, No. 10, p. 5, Mar. 1964.

*Primary Examiner*—Neil Abrams
*Attorney, Agent, or Firm*—Allan B. Osborne

[57] ABSTRACT

The present invention relates to a connecting element of the type for interconnecting electrical circuits on two electronic component-carrying devices such as printed circuit boards and substrate devices. More particularly the invention discloses a connecting element having a symmetrical, sinuous shape so as to provide a spring section for exerting a determined contact force. Further, the connecting element has, as an integral part thereof, a shorting beam to provide a shorter electrical path and to provide a spring means to hold the element in a housing.

8 Claims, 3 Drawing Figures

FIG. 2
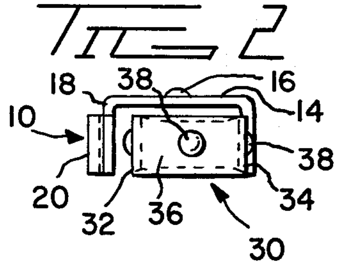
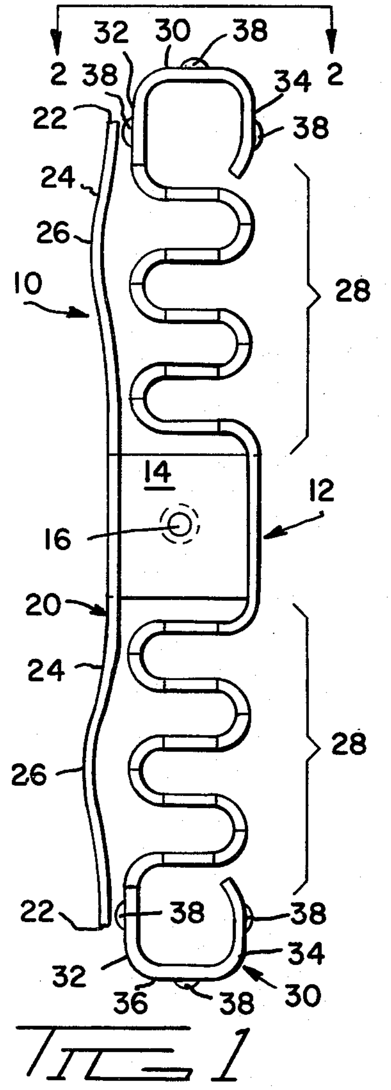
FIG. 1
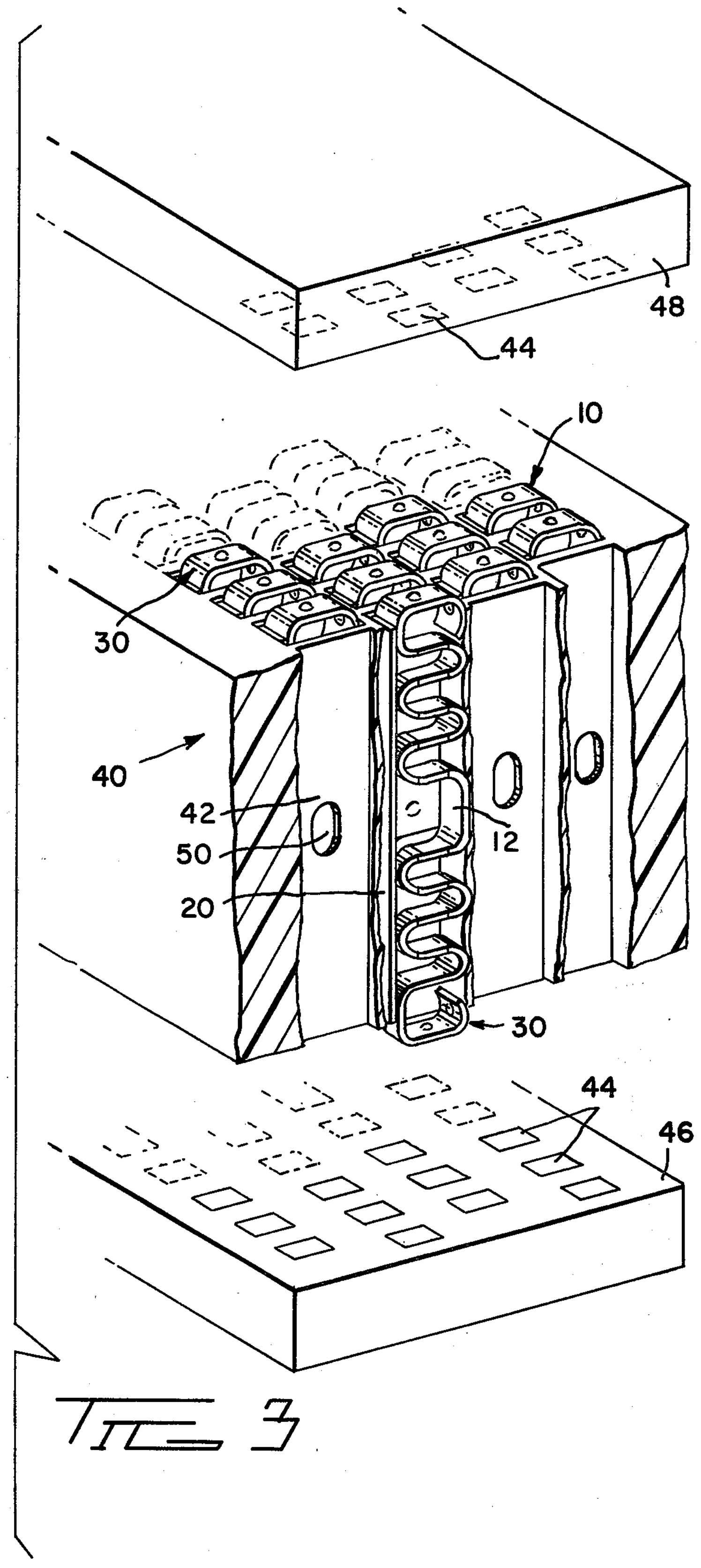
FIG. 3

CONNECTING ELEMENT FOR SURFACE TO SURFACE CONNECTORS

BACKGROUND OF THE INVENTION

1. Field of the Invention

This invention is in the field of electrical interconnecting devices for printed circuit boards, substrate devices and the like.

2. Description of the Prior Art

Example of prior art surface-to-surface connectors and their connecting elements include the following:

| Patent | Patentee | Class/Subclass |
|---|---|---|
| 3,877,064 | Scheingold et al | 357/74 |
| 3,910,664 | Pauza et al | 339/17CF |
| 4,052,118 | Scheingold et al | 339/17CF |

The present invention is a novel improvement and a significant departure from at least the above.

Recent advances in micro-circuit techniques have allowed the size of individual electronic components to be significantly reduced. Thus, while a large number of components may be packaged in a very small volume, the need arises to provide a corresponding number of electrical connection. One problem with forming electrical connecting elements for such packages is that the dimensions and physical tolerances of the connections to the packages are extremely small and thus very critical. That is, the spacing between pads require connectors with such close contact spacing that the normal contact forces cannot be achieved. As a result, resistance and inductance values are so high as to be almost unacceptable. Capacitance values also are at nearly unacceptable levels.

The aforementioned prior art patents have addressed these problems with success. However, as the technology is in a state of continual change, new and improved interconnecting devices are required to meet the advancement. Such advancements are being made primarily with respect to printed circuit boards and substrate devices, the latter particularly so. Further, there is an increasing need for stacking numbers of boards and substrate devices together with devices for interconnecting the circuiting pads thereon. Such interconnecting devices must be small themselves with the spacing between contacts incredibly tiny, and such devices must be able to accommodate thermal shock and changes without losing the integrity of the electrical connections.

SUMMARY OF THE INVENTION

According to one aspect of the invention, there is provided a connecting element having a sinuous spring section with contacts at both ends and an integral shorting beam to both shorten the electrical path between the contacts and to provide a biasing means for holding the connecting element in the housing.

BRIEF DESCRIPTION OF THE DRAWINGS

FIG. 1 is a side elevation view of the connecting element of the present invention;

FIG. 2 is a top plan view taken along lines 2—2 on FIG. 1; and

FIG. 3 is a view, partly in perspective and partly in section, showing the connecting element of FIG. 1 in a suitable housing.

DESCRIPTION OF THE INVENTION

Connecting element 10 of the present invention is shown in profile in FIG. 1 and in a top plan view in FIG. 2. Preferrably the element is stamped and formed from a coplanar strip of material (not shown) such as beryllium copper. It is symmetrical in the sense that the top half is the mirror image of the lower half.

The connecting element has a stable center section 12 from which a connecting strap 14 extends across the width of the element and out to one side. A dimple 16 stamped in the strap projects outwardly therefrom.

The free end of the strap bends around ninety degrees to the back side of the element as shown by reference numeral 18 in FIG. 2. A resilient shorting beam 20 is integrally attached to the free end and extends along the back side of the element. Beam 20 preferrably has a width equal to the thickness of the connecting element as can be seen in FIG. 2. Its length is almost equal to the element's body length. From its strap connection towards the two free ends 22, the beam may be defined as having two sections 24. Each section from the strap outwardly, is straight for a short length after which the remaining length is convexly shaped away from the body portion with reference numeral 26 indicating the peak.

The body portion of the connecting element includes center section 12 and two, double S-shaped, spring sections 28, one on either side of the center section. Further included are two contact sections 30, one at the free end of each spring section.

As seen from the profile of the element in FIG. 1, contact sections 30 have three sides, back side 32, front side 34 and top side 36. Each side is at approximately ninety degree angle to the adjacent side with the corners preferrably rounded. Note that the free end of front side 34 curves inwardly.

Each of the sides have a dimple 38 whose convex side faces outwardly. The dimples on back and top sides 32 and 36 respectively provide electrical contact points.

FIG. 3 shows one form of housing 40 suitable for connecting elements 10. The housing has a plurality of cells 42 each of which receives an element 10. The dimension of the cell is such that as the connecting element is pressed in, beam 20 is deflected so that its free ends 22 contact the dimples on back side 32 of the contact sections. The deflection is preferrably such that only peaks 26 abut the cell wall. There is some sliding on the part of the beam so that a wiping action between it and the dimples occurs, resulting in good electrical contact. The connecting elements are secured in the cells by the cell walls applying pressure against the beam and the dimples on front side 34 of contact sections 30. Creep effects are prevented by the resiliency of beam 20. As FIG. 3 shows, the top sides 36 and the dimples thereon extend out of the surface of the housing so as to make contact with circuit pads 44 on PCB 46 below the housing and a substrate device 48 above.

Each side wall of cells 42 have an oval opening 50 in which dimple 16 on strap 14 is received. The opening allows some limited vertical movement of the connecting element when a force is exerted on one end or the other.

In summary, connecting element 10 provides an electrical interconnection having good spring characteristics due to its S-shaped spring sections although the drawing shows double S-shaped spring sections, it should be understood that there can be any number of such sections. With top sides 36 extending free of the housing the element can absorb squeezing by the sandwiching boards without losing good electrical contact therewith, and without getting mechanically overstressed.

The presence of shorting beam 20 effectively reduces the electrical path length without sacrificing effective spring capability. The beam also biases the connecting element in a housing cell and absorbed dimensional changes of such by its resiliency.

The contact dimples may be selectively plated such as with gold over nickel or other suitable plating compounds.

As noted above, the connecting elements are preferably and more economically made by stamping and forming with the stamped and formed elements reeled on strip for subsequent use.

The connecting elements of the present invention lend themselves quite well to devices having a high density of circuit pads on their surfaces. The construction of the elements enables them to be densely packaged in a connector housing without their desirable spring and contact characteristics.

The present invention may be subject to many modifications and changes without departing from the spirit or essential characteristics thereof. The present embodiments are therefore to be considered in all respects as illustrative and not restrictive of the scope of the invention.

What is claimed is:

1. A connecting element for interconnecting electrical circuits on two devices having identically arranged circuit pad patterns, which comprises:

a. a body portion having multiple, S-shaped spring sections on both sides of a center section;

b. contacts at the free ends of the spring sections; and c. a resilient shorting beam attached to the center section and spaced from the body portion, said beam extending to the contacts at the ends of the spring section and adapted to be biased thereagainst.

2. The connecting element of claim 1 wherein the contacts include three sides, each at ninety degrees to an adjacent side.

3. The connecting element of claim 2 wherein outwardly projecting dimples are located on the contact sides, the dimples on one side being adapted to electrically engage the shorting beam.

4. The connecting element of claims 1, 2 or 3 wherein the shorting beam comprises two sections, each extending in opposite directions from the center section and each beam section being generally curved with the concave side facing the body portion.

5. An interconnecting device comprising:

a. a housing of insulating material having a plurality of cells extending therethrough, each cell being isolated from the adjacent cells;

b. a plurality of connecting elements positioned in the cells, said elements having an elongated body portion consisting of two spring sections of sinuous form separated by and attached to a center section, contacts at the free ends of the spring sections and a resilient shorting beam attached to and extending from the center section to a position spaced from the body portion, said shorting beam being biased towards said body portion by the cell walls so that the ends of the beam engages the contacts to provide an electrical path from one contact to another.

6. The connecting element of claim 1 wherein said body portion has a double, S-shaped spring section on both sides of the center section.

7. The interconnecting device of claim 5 wherein said spring sections have a double, S-shape.

8. The interconnecting device of claim 5 wherein said shorting beam includes two sections, one on either side of the center section, said sections being generally curved with the concave side facing the body portion.

* * * * *